United States Patent [19]

Anthony et al.

[11] 4,437,109
[45] Mar. 13, 1984

[54] SILICON-ON-SAPPHIRE BODY WITH CONDUCTIVE PATHS THERETHROUGH

[75] Inventors: Thomas R. Anthony, Schenectady; Richard J. Connery, Liverpool, both of N.Y.; David F. Hoeschele, Jr., Boyertown, Pa.

[73] Assignee: General Electric Company, Schenectady, N.Y.

[21] Appl. No.: 204,957

[22] Filed: Nov. 7, 1980

[51] Int. Cl.³ .................... H01L 29/06; H01L 23/48
[52] U.S. Cl. .......................... 357/68; 357/55; 357/65; 174/68.5
[58] Field of Search ............... 357/68, 55, 65, 23 TF, 357/47; 174/68.5; 339/59 M

[56] References Cited

U.S. PATENT DOCUMENTS 3,323,198  6/1967  Shortes .............................. 29/155.5
4,050,756  9/1977  Moore ................................ 174/68.5

OTHER PUBLICATIONS

T. R. Anthony and P. A. Lindner, "The Reverse Laser Drilling of Transparent Materials", *Journal of Applied Physics*, vol. 51, No. 11, (1980), pp. 5970-5975.
*Lasers in Industry*, edited by S. S. Charschan (Van Norstrand Reinhold Co., 1972, p. 247).

*Primary Examiner*—Andrew J. James
*Assistant Examiner*—J. Carroll
*Attorney, Agent, or Firm*—Leo I. MaLossi; James C. Davis, Jr.; James Magee, Jr.

[57] ABSTRACT

Electrically conductive paths are provided for the high-speed low-loss transfer of electrical signals between integrated circuits of a single silicon-on-sapphire body or between integrated circuits of several silicon-on-sapphire bodies. The conductive paths through the silicon-on-sapphire bodies are made by a process involving implantation of a conductive material in laser-drilled holes.

10 Claims, 5 Drawing Figures

SILICON-ON-SAPPHIRE BODY WITH CONDUCTIVE PATHS THERETHROUGH

This invention relates to the manufacture of semiconductor devices and more particularly to the formation of electrically conductive paths through silicon-on-sapphire bodies in order to reduce the number and length of conductive interconnections between logic and switching elements on a single wafer or between wafers in a multiwafer system.

CROSS-REFERENCE

This invention is related to the following coassigned, copending U.S. Patent applications: Ser. No. 244,854 (now U.S. Pat. No. 4,394,712) filed Mar. 18, 1982, and Ser. Nos. 285,656 (now U.S. Pat. No. 4,368,106) and 285,668(now U.S. Pat. No. 4,396,467), both of which were filed July 21, 1981. The Ser. No. 285,656 application is a Continuation-in-Part of application Ser. No. 200,770, filed Oct. 27, 1980, and now abandoned. Application Ser. No. 423,334 filed Sept. 24, 1982, is a Division of the Ser. No. 285,656 application.

BACKGROUND OF THE INVENTION

Computer science has developed in an era of computer technology in which wire interconnects were inexpensive and logic and switching elements were expensive. Integrated circuit technology has recently reversed the cost situation leaving wire interconnects as the more expensive component. Interconnections between the integrated circuits of a single chip or wafer, whether made of wires or strips of conducting material, are expensive because they occupy most of the space on the wafer and cause most of the delay in electronic signals passing through the system. The same reasoning holds for interconnections between wafers. Computer architecture theory has just begun to take the cost reversal generated by integrated circuit technology into consideration. As a result, computer design has not yet taken advantage of the full range of capabilities implicit in microelectronics.

Current advances in computer design involve the development of a massively parallel information processing system for ultrahigh speed processing of multiple digital data streams. Such multiple data streams are encountered in situations where interactions of the physical data are significant as, for example, in image processing and studies of weather conditions, economics, hydrodynamics and stresses. The massively parallel array processor with many processors operating simultaneously and in parallel requires many interconnections between processors. With multiple processors, the number of interconnections, the space occupied by interconnections, the delay time caused by interconnections, the power consumed in interconnections, and the cost of interconnections has increased as the square of the number of processors in the system.

The massively parallel array processor system is built utilizing Complementary Metal Oxide Semiconductor/Silicon-on-Sapphire Large Scale Integration (CMOS/SOS LSI) circuitry. Processor arrays on many individual silicon-on-sapphire wafers must also be interconnected. In current technology, all such interconnections must run out to a pad on the edge of a wafer or chip. Such an interconnection scheme has several disadvantages.

First, the number of interconnection pads on the periphery of an LSI circuit is very limited. The relatively small number of interconnection pads severely restricts the information flow to and from an LSI circuit. For example, a typical memory chip has 16,384 bits arranged in a 128 by 128 array. An entire row of 128 bits can be accessed at one time, but a selector enables only a single bit to pass to an output pin. A typical memory system is made of 2,048 such chips arranged in 64 groups of 32. Only 32 chips can place their outputs on the 32 wires that join the bus to the central processor. Of the 262,144 bits that move less than a millimeter on each chip, only 2,048 move 3 millimeters to get off their chip and only 32 move a meter to the processor. In other words, because of an effective traffic tie-up on the interconnections, only about eight-thousandths of the available density of the memory chip can be used.

The second disadvantage of the interconnection scheme used by current technology is that a large fraction of the area of an LSI circuit is devoted to interconnections. This waste of a large area of a chip or a wafer is a direct consequence of the restriction of interconnections to substantially two-dimensional configurations. Previous methods of providing conventional conductive paths in three-dimensional configurations by placing the paths in layers on one chip have generally resulted in a decrease in the quality of the processed information due primarily to the phenomenon of cross-talk.

Therefore, it is an object of this invention to provide a new and improved means of reducing the area occupied by interconnections on LSI and Very Large Scale Integration (VLSI) circuits.

Another object of this invention is to provide a new and improved means of increasing the number of interconnects between processors and memory sections of a computing system.

A further object of this invention is to provide a new and improved means of reducing the time delay caused by interconnections in a microelectronic circuit.

Another object of this invention is to provide a new and improved means of reducing the power consumed by interconnections in microelectronic circuits.

Another object of this invention is to provide an interconnection architecture that allows very compact packaging of microelectronic circuits.

Other objects of this invention will, in part, be obvious and will, in part, appear hereinafter.

SUMMARY OF THE INVENTION

In accordance with the present invention, a large number of small diameter closely-spaced electrically conductive paths are introduced through silicon-on-sapphire wafers used in information processing equipment. These electrically conductive paths reduce the number and length of conductive interconnections between logic and switching elements on a single wafer or between the wafers in a multi-wafer system thus providing, for example, increased speed and quality of information processing, decreased power requirements, and more compact packaging of microelectronic circuits.

In view of the discoveries of this invention, those skilled in the art will understand that this invention has both method and article aspects. Briefly described, in its article aspect, this invention takes the form of a body of silicon-on-sapphire material most usually in the form of a wafer. Patterned arrays of holes are provided through the silicon-on-sapphire wafer into which a conducting material such as gold or silver is implanted thereby providing conducting paths between the opposed front and back major surfaces of the wafer. These through-wafer conducting paths substantially reduce the number and length of conductive paths needed on the front face of the wafer; reduce the time delay of electrical signals traversing interconnects by shortening their length; reduce the power consumed by and the heat generated in interconnections; and provide many more access paths to logic, switching and memory elements on the front face of the wafer. Further, these through-wafer conducting paths provide a means of substantially reducing the physical space occupied by microelectronic circuits by allowing the silicon-on-sapphire wafers to be stacked one on another with the feed-through conductors in each wafer serving as interconnection paths from wafer to wafer.

Similarly described, and in its most elementary respect, the method of this invention comprises the steps of preparing a silicon-on-sapphire body for hole drilling, drilling holes through the body by means of a laser beam device and depositing an electrically conducting material in the holes.

BRIEF DESCRIPTION OF THE DRAWINGS

The invention is more clearly understood from the following description taken in conjunction with the accompanying drawings wherein some details have been disproportionately enlarged for clarity and of which.

DETAILED DESCRIPTION OF THE INVENTION

Figure 1:
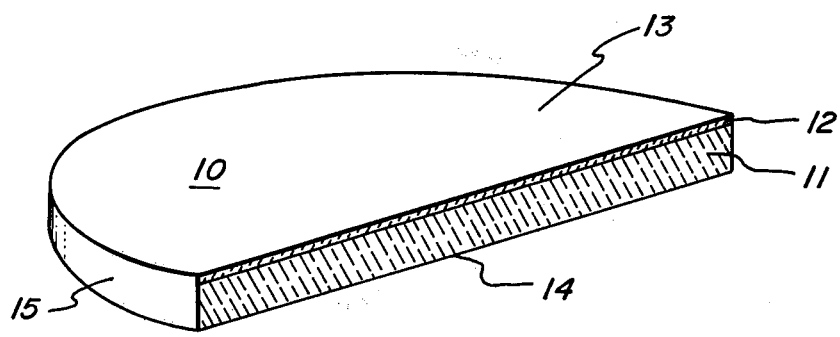
FIG. 1 is a dimensional cross section of a typical silicon-on-sapphire body.

Referring now to FIG. 1, there is shown a typical silicon-on-sapphire (SOS) body 10. The body 10 is a composite of a substrate of single crystal sapphire 11 and a contiguous overlaying epitaxially-grown layer of single crystal silicon 12. The body 10 has front, or top, 13 and back, or bottom, 14 major opposed substantially parallel surfaces and a peripheral edge area 15 interconnecting the front 13 and back 14 major surfaces. The two major surfaces are parallel to the ($1\bar{1}02$) plane of the single crystal sapphire 11 to within $\pm 2°$ and to the (100) plane of the single crystal epitaxial silicon 12 to within $\pm 2°$. The exposed silicon of the front major surface 13 of the wafer is polished to an optical finish smoother than about $\pm 0.1$ micron and the exposed sapphire of the back major surface 14 of the wafer 10 is ground to a finish smoother than about $\pm 0.5$ micron. One or more active integrated circuit semiconductor devices are ordinarily located in the silicon layer 12. The thickness of the epitaxial silicon layer 12 is typically less than about 4 microns while a typical thickness of the sapphire layer 11 is $325 \pm 25$ microns.

Figure 2:
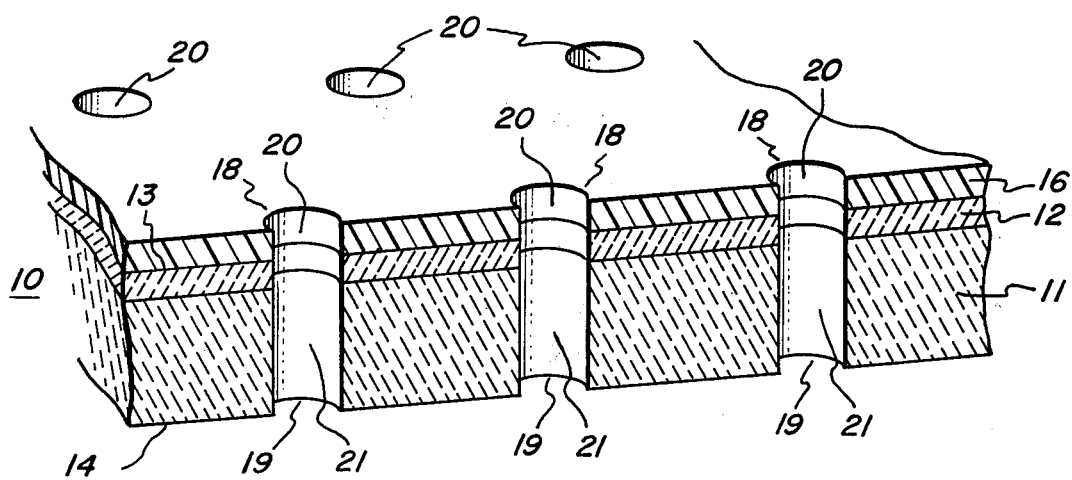
FIG. 2 is an enlarged schematic dimensional view in cross section of a section taken from the silicon-on-sapphire body of FIG. 1 following laser drilling of holes through the body.
Figure 3:
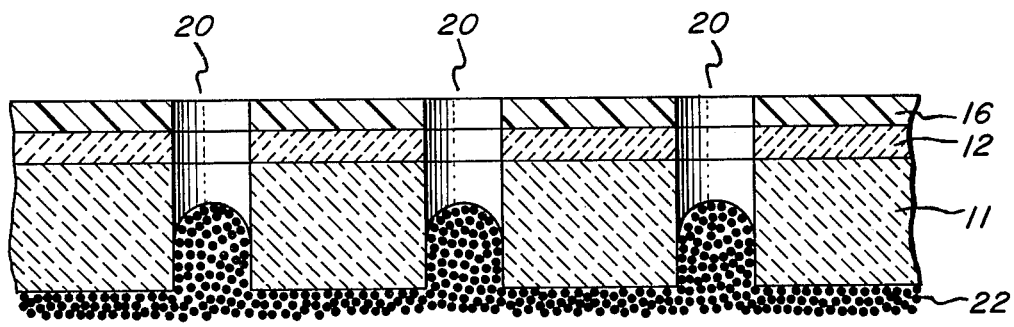
FIG. 3 is a schematic elevation view in cross section of the silicon-on-sapphire section of FIG. 2 shortly after application of a conductor-bearing fluid.

With reference to FIGS. 2 and 3, the description of the fabrication of feed-throughs in accordance with the teachings of this invention may be facilitated. The method of this invention will produce feed-throughs useful in the transfer of electrical signals from an integrated circuit on one SOS wafer to one or more integrated circuits on the same SOS wafer and/or to one or more integrated circuits on different SOS wafers.

In preparation for laser drilling and implantation of the feed-through conductors, a protective layer 16, shown in FIG. 2, was applied to the front 13 major surface of the SOS body 10. The protective layer 16 protects the active devices in the silicon layer 12 during laser drilling and may be made from, for example, silicon nitride, a low temperature glass, or photoresist.

Holes 20, as shown in FIG. 2, were then drilled in the SOS wafer 10 using laser beam techniques discovered in the course of this invention. The drilling may proceed by impinging the beam on the back surface 14 and drilling to the front surface 13 of wafer 10 or vice versa. In FIG. 2, the laser beam has impinged on top surface 13 and drilling has schematically proceeded from top surface 13 to bottom surface 14; thus, entrance apertures 18 are formed in surface 13, and protective layer 16, and exit apertures 19 are formed in surface 14. Interior peripheral edge area 21 interconnects the entrance 18 and exit 19 apertures.

Since the exit aperture of the hole may be smaller than the entrance aperture, it is generally advantageous to drill from the back surface 14 since the exit aperture will occupy less area on the surface 13 where the active devices are located and the debris generated by drilling will be ejected out the bottom. However, accuracy of location of the aperture on the surface 13 will be less than if the drilling proceeds from the front surface 13. Therefore, if accurate location of the feed-through on the surface 13 where the integrated circuits are located is the paramount consideration, the drilling is best conducted from front surface 13 to the back surface 14.

It has been discovered that a laser operated in accordance with the teachings of this invention is the best device for drilling the holes. Mechanical means, such as ultrasonic drilling, cannot produce holes of the fine diameter and close spacing required primarily due to drill breakage from chips in the drill hole as attempts are made to drill holes less than about 8 mils in diameter. The pulse length of other beam devices, such as electron beams, cannot be limited to sufficiently short times to prevent cracking and spalling of the wafer due to thermal stresses. By optical inspection of the birefringent sapphire using crossed polarizers, no strain fields were observed around the laser-drilled holes.

It has been further discovered that a Nd-YAG laser operated in the pulsed Q-switched mode is best suited for the drilling of holes in SOS bodies. Typically, a continuous train of laser pulses at a pulse repetition rate of 3 KHZ and an individual pulse duration of 200 nanoseconds is directed onto and perpendicular to surface 13 or 14. The continuous train of laser pulses is beamed onto surface 13 or 14 for 5 msec and then interrupted for 45 msec and repeated for 5 msec and then interrupted for 45 msec and so forth until the laser beam has drilled a hole 20 completely through body 10.

Approximately 30 pulse trains are required to form holes 20 in a silicon-on-sapphire wafer that is 325 microns thick. The 3 KHZ pulse repetition rate is selected because it gives the highest output power of the laser operating in the repetitively Q-switched mode. Each pulse train is led by a giant pulse which is important because it greatly increases the absorption coefficient of the surface layer of body 10, allowing the following smaller pulses of the pulse train to vaporize and drill out the material comprising body 10. A series of separate pulse trains is used rather than one continuous pulse train in order to obtain more of the desirable giant pulses. The delay time of 45 milliseconds between pulse trains is chosen so that the flash lamps surrounding the Nd-YAG laser crystal have sufficient time to pump up the crystal to an energy density where a giant pulse is produced on initiation of a repetitively Q-switched train of laser beam pulses.

A relationship between laser power level, the number of pulses required to drill holes 20 completely through the body 10, and hole geometry and integrity was discovered during the course of this invention. Nd-YAG lasers with an energy rating of less than 1 watt in the continuous wave (CW) mode could not drill all the way through SOS wafers 325 microns thick. Use of high energy lasers is limited in that if fewer than 10 pulse trains are used, cracking and spalling of the wafer 10 will occur. Lower power lasers, about 6 watts in the CW mode, which required more than 100 pulse trains to drill through the 325 micron thick SOS wafers were also found to be unsatisfactory. When more than 100 pulses were required, the holes were not straight, but exhibited a random walk effect through the body 10 such that the exit apertures frequently were not aligned with the entrance apertures i.e. the axes of the holes were not substantially perpendicular to the major surfaces. Thus the power of the Nd-YAG laser must be such that the holes can be drilled using about 10 to about 100 pulses. At the low end of the pulse range, holes having the appearance of right circular cylinders with generally circular entrance and exit apertures about 4 mils in diameter can be produced. As the number of pulses increases, the diameter of the entrance aperture decreases, but the holes assume the shape of truncated right-circular cones. Use of about 30 pulses was found to be optimum in that truncated cone-shaped holes with entrance diameters on the order of 2 mils and an entrance aperture to exit aperture ratio of about 2 to 1 were produced. These holes can be spaced in arrays having center-line-to-center line, i.e. axis-to-axis, spacings as small as about twice the diameter of the aperture or, in the case of holes having the shape of a truncated cone, about twice the diameter of the larger aperture.

Considering "aspect ratio" as the ratio obtained by dividing the thickness of the SOS wafer by the diameter of the entrance aperture, both thickness and diameter being measured in the same units, with the hole entrance aperture diameters disclosed herein (i.e. largest value 150$\mu$; smallest value 0.5 mil, which equals 12.7$\mu$) for holes through SOS wafers of 325$\mu$ nominal thickness, aspect ratios ranging from about 2.17:1 to about 25.59:1 have been demonstrated.

When the Nd-YAG laser was operated in the frequency doubled mode (0.53$\mu$ wavelength), at a power level sufficient to produce holes with about 30 pulses, truncated cone-shaped holes having entrance aperture diameters as small as 0.5 mil and exit aperture diameters as small as 0.25 mil were produced. However, as the diameter of the apertures decreases, it becomes more difficult to implant the conducting medium of the feedthrough conductors in the holes.

It was also found that drilling, particularly from the back surface of the wafer 10, was facilitated by positioning a 0.025" thick polycrystalline wafer of alumina 0.025" from and parallel to the back ground surface 14 of the SOS wafer 10 especially at lower power levels approaching 6 watts in the CW mode. At a separation distance greater than 0.025", drilling yields decreased. At closer separation than 0.025", there was insufficient distance between surface 14 and the polycrystalline alumina backup wafer for debris from laser drilling to clear the region around the intersection between holes 20 and the back surface 14 of body 10 with the result that the holes 20 became clogged with drilling debris near surface 14.

Next, a thin layer of a conductor-filled liquid 22 which wets the SOS material is applied to one of the two major surfaces, 13 and 14, of the SOS body. The conductor-filled liquid in its cured form should have a volume resistivity that is less than or equal to about $1 \times 10^{-4}$ ohm-cm. As shown schematically in FIG. 3, it is preferable to apply the liquid 22 to the back surface of the body 10. Because the liquid 22 wets the SOS material, it is drawn by capillary action into the laser-drilled holes 20, carrying the suspended conducting particles with it. Silver and gold are particularly suitable for use as the conducting particles.

Two types of conductor-filled liquids were found to be particularly suitable. One was a pure silver-bearing conductive epoxy (Ablebond 826-1 by Ablestik Laboratories, for example) that had a volume resistivity of about $10^{-4}$ ohm-cm after curing for one-half hour at 150° C. The other conductive liquid was a pure silver-bearing conductive polyimide (BE-225H by Bergston and Associates, for example) that also had a volume resistivity of about $10^{-4}$ ohm-cm after curing by solvent evaporation for two hours at 150° C. An advantage of the epoxy-based liquid is that there is no discernible shrinkage on curing. In contrast, as the solvent evaporates during curing of the polyimide-based liquid it shrinks about 20%. The advantages of the silicone polyimide are that it will withstand high temperatures (550° C. for one-half hour in pure oxygen) and that it exhibits no outgassing once it is cured. Both liquids contained rough angular silver particles with an average diameter of approximately four microns.

Fill times on the order of 0.76 seconds were observed for hole sizes ranging between 57 to 150 microns in diameter. The composition of the liquid in the laser-drilled hole, however, varied greatly with hole size. For holes that were 125 and 150 microns in diameter, the composition of the liquid implanted in the holes was that of the initial conductor-filled liquid. In contrast, for smaller laser-drilled holes that were 100, 80, and 57 microns in diameter, the concentration of silver particles in the liquid in the hole dropped rapidly with decreasing hole size. The smallest hole size contained essentially no silver particles and was filled with only the pure carrier liquid. Microscopic observation indicated that the four-micron silver particles became clumped together and occluded the hole entrance thus preventing movement of particles into the hole while allowing infiltration of the pure carrier liquid. Several means of forcing the silver particles into the holes were tried. First, a vacuum was produced on one face of the wafer so ambient pressure on the opposite face of the wafer would force the liquid suspension into the hole. This only caused pure liquid to flow through and exude from the hole, while the silver particles remained clumped and jammed near the hole entrance. Next, the wafer was subjected to ultrasonic vibrations both with and without the use of vacuum to see if the vibrations would break up the jam of particles at the hole entrance. This technique also failed to implant the silver particles in the hole. Thus if a hole size of about 100 microns is taken as the cutoff hole size below which four-micron silver particles will not flow by capillary action, then implantation by capillary wetting is generally not feasible below a hole diameter/particle diameter ratio of approximately 25.

If the carrier fluid does not wet sapphire, or its viscosity is so high that filling times become excessive, a wedge extrusion technique is advantageously employed. While the prospect of forcibly injecting the fluids into the holes using a hypodermic needle-type apparatus appeared promising, actual implementation proved difficult due to the small size of the holes and their close spacing.

Figure 4:
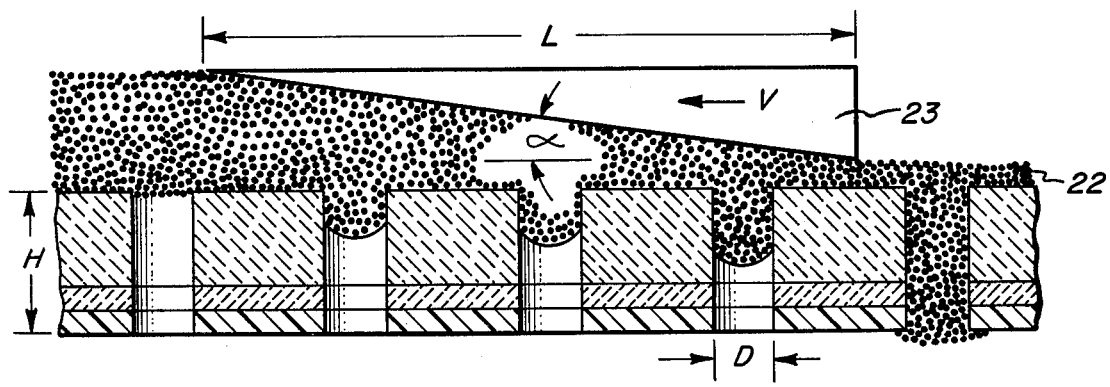
FIG. 4 is a schematic elevation view in cross section of a section of a silicon-on-sapphire body showing the critical parameters for feed-through implantation by the wedge extrusion method.

Wedge extrusion makes use of the well-known phenomenon that two solid bodies can easily slide over one another when a thin layer of liquid between them has a high positive pressure. As shown schematically in FIG. 4, to develop a high positive pressure in a liquid layer between the two planar solid bodies, the planes of the respective bodies must form a small angle and move relative to each other. As a result of the thinness of the liquid layer, the rate of strain due to viscosity is high in the liquid. With the wedge-like configuration shown in FIG. 4, the high rate of strain in the liquid layer produces a high pressure in the liquid layer.

The filling of laser-drilled holes of a given diameter (D) and length (H) by wedge extrusion is governed by the equation $$H = D\alpha^{-3/2}$$

wherein $\alpha$ is the angle that the wedge makes with the SOS wafer. Thus, in wedge extrusion, the filling of the laser-drilled holes is independent of the viscosity of the liquid suspension, the velocity (V), of the wedge 23, and the length (L) of the wedge 23. For laser-drilled holes with a diameter of 57 microns in a SOS wafer that is 330 microns thick, the wedge angle $\alpha$ must be less than 0.3 radians in order for the wedge extrusion action to completely fill the holes. The wedge extrusion method, however, will also be ineffective at hole diameter/particle diameter ratios less than about 25 due to occlusion of the holes by the particles.

Figure 5:
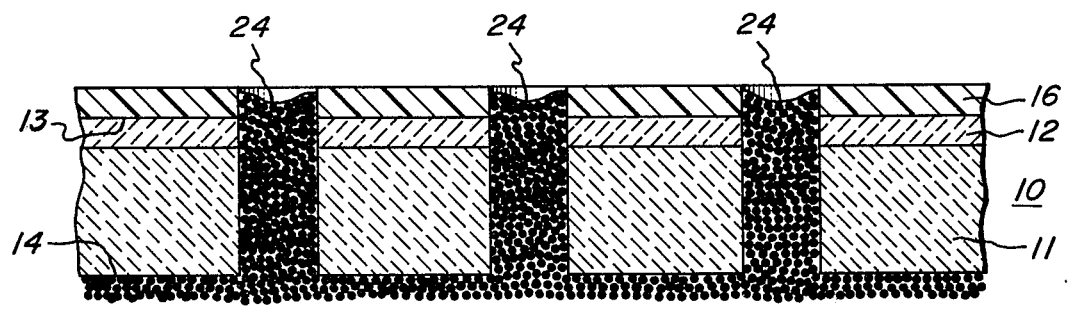
FIG. 5 is a schematic elevation view in cross section of a section of a completed silicon-on-sapphire wafer with implanted feed-through conductors following curing by solvent evaporation.

Referring now to FIG. 5, typical fully formed and cured feed-through conductors are shown schematically extending between the major opposed surfaces, 13 and 14, in a section of an SOS body. The feed-through conductors 24 of FIG. 5 are typical of those formed with the polyimide-based liquid, which shrinks about 20% on curing, and will be of two phases i.e., the metallic particles plus residual binder. The polyimide covering the back major surface 14 of the SOS body 10, can be patterned using conventional photolithographical or plasma etching techniques to provide electrical connections between feed-throughs.

Although this invention has been described with reference to silicon-on-sapphire material, the novel technology and objectives of this invention of preparing a body with feedthrough conductors is broadly applicable to other materials of the semiconductor arts including, for example, silicon (Si), germanium (Ge), gallium phosphide (GaP), gallium arsenide (GaAs), indium antimonide (InSb), cadmium telluride (CdTe), and zinc sulfide (ZnS).

Further, while the invention has been particularly shown and described with reference to several preferred embodiments thereof, it will be understood by those skilled in the art that various changes in form and detail may be made therein without departing from the true spirit and scope of the invention as defined by the appended claims.

We claim as our invention:

1. An article of manufacture comprising:
   (a) a body of layered silicon-on-sapphire having
      (i) top and bottom major opposed surfaces substantially parallel to each other, and
      (ii) an outer peripheral edge area of silicon and sapphire interconnecting said major surfaces, said top major surface being silicon and said bottom major surface being sapphire; and
   (b) a plurality of electrically conducting paths interconnecting said major surfaces, each of said paths comprising a hole substantially filled with an electrically conducting mass of unified particles, each hole having a generally circular entrance aperture about 4 mils or less in diameter and a generally circular exit aperture at opposite ends thereof, said entrance aperture lying in the plane of one of said major surfaces and having a first diameter, said exit aperture lying in the plane of the opposite major surface and having a second diameter substantially equal to or less than said first diameter and said hole having an aspect ratio in the range of from about 2.17:1 to about 25.59:1, each path having an axis, said axis being substantially perpendicular to the planes of said major surfaces with the centers of said entrance and said exit apertures being substantially colinear therewith, and said paths being arranged in a substantially periodic array, said array having a center line-to-center line spacing substantially equal to twice said first diameter.

2. The article of claim 1 wherein said entrance aperture lies in the plane of said top major surface of said body and said exit aperture lies in the plane of said bottom major surface of said body.

3. The article of claim 1 wherein said entrance aperture lies in the plane of said bottom major surface of said body and said exit aperture lies in the plane of said top major surface of said body.

4. The article of claim 1 wherein the particles are metallic.

5. The article of claim 4 wherein the volume resistivity of said mass is less than or equal to about $1 \times 10^{-4}$ ohm-cm.

6. The article of claim 5 wherein the particles are silver.

7. The article of claim 1 wherein said body has a plurality of semiconductor devices in said top major surface.

8. The article of claim 1 wherein each path is in the general form of a right circular cylinder, said entrance and exit apertures being generally in the form of circles of substantially equal diameter.

9. The article of claim 1 wherein each path is in the general form of a frustum of a right circular cone, said entrance and exit apertures being generally in the form of circles of unequal diameter.

10. The article of claim 1 wherein the aspect ratio is in the range of from about 2.17:1 to about 3.25:1.

* * * * *